US010512166B2

(12) United States Patent
Cheng

(10) Patent No.: US 10,512,166 B2
(45) Date of Patent: Dec. 17, 2019

(54) MANUFACTURING METHOD OF CIRCUIT BOARD AND STAMP

(71) Applicant: Unimicron Technology Corp., Taoyuan (TW)

(72) Inventor: Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 221 days.

(21) Appl. No.: 15/273,727

(22) Filed: Sep. 23, 2016

(65) Prior Publication Data

US 2017/0273191 A1    Sep. 21, 2017

Related U.S. Application Data

(60) Provisional application No. 62/309,930, filed on Mar. 17, 2016.

(51) Int. Cl.
| *H05K 3/00* | (2006.01) |
| *H05K 3/06* | (2006.01) |
| *G03F 7/00* | (2006.01) |
| *H05K 3/46* | (2006.01) |
| *G03F 7/16* | (2006.01) |
| *G03F 7/20* | (2006.01) |
| *H05K 1/11* | (2006.01) |
| *H05K 3/10* | (2006.01) |

(52) U.S. Cl.
CPC ........... *H05K 3/064* (2013.01); *G03F 7/0002* (2013.01); *G03F 7/162* (2013.01); *G03F 7/20* (2013.01); *H05K 1/115* (2013.01); *H05K 3/0023* (2013.01); *H05K 3/06* (2013.01); *H05K 3/108* (2013.01); *H05K 3/465* (2013.01); *H05K 3/4644* (2013.01); *H05K 2201/091* (2013.01); *H05K 2203/0108* (2013.01); *H05K 2203/0369* (2013.01); *H05K 2203/0502* (2013.01); *H05K 2203/0548* (2013.01); *H05K 2203/0562* (2013.01); *Y10T 29/49124* (2015.01); *Y10T 29/49155* (2015.01)

(58) Field of Classification Search
CPC ............... G03F 7/0002; H05K 3/0023; H05K 2203/0108; Y10T 29/49124; Y10T 29/49155
USPC .......................................................... 430/269
See application file for complete search history.

(56) References Cited

U.S. PATENT DOCUMENTS 9,018,096 B2 *  4/2015  Price ................... H01L 21/7688
                                                        257/E21.586

FOREIGN PATENT DOCUMENTS

| CN | 102046357 | 5/2011 |
| TW | 527739 | 4/2003 |
| TW | I335490 | 1/2011 |

OTHER PUBLICATIONS

"Office Action of Taiwan Counterpart Application", dated Jan. 10, 2017, p. 1-p. 4, in which the listed reference as cited.

* cited by examiner

*Primary Examiner* — Daborah Chacko-Davis
(74) *Attorney, Agent, or Firm* — JCIPRNET

(57) ABSTRACT

A manufacturing method of a circuit board and a stamp are provided. The method includes the following steps. A circuit pattern and a dielectric layer covering the circuit pattern are formed on a dielectric substrate. A conductive via connected to the circuit pattern is formed in the dielectric layer. A photoresist material layer is formed on the dielectric layer. An imprinting process is performed on the photoresist material layer using a stamp to form a patterned photoresist layer, wherein the pressing side of the stamp facing the circuit pattern becomes sticky when subjected to pressure so as to catch photoresist residue from the photoresist material layer in the imprinting process. A patterned metal layer is formed on a region exposed by the patterned photoresist layer. The patterned photoresist layer is removed.

6 Claims, 5 Drawing Sheets

MANUFACTURING METHOD OF CIRCUIT BOARD AND STAMP

CROSS-REFERENCE TO RELATED APPLICATION

This application claims the priority benefit of U.S. provisional application Ser. No. 62/309,930, filed on Mar. 17, 2016. The entirety of the above-mentioned patent application is hereby incorporated by reference herein and made a part of this specification.

BACKGROUND OF THE INVENTION

Field of the Invention

The invention relates to a manufacturing method of a circuit board and a stamp, and more particularly, to a manufacturing method of a circuit board in which photoresist residue or dielectric residue is removed using an adhesive layer and a stamp used in the method.

Description of Related Art

Nano-imprint lithography (NIL) is a technique for manufacturing fine circuits and is extensively applied in the LED and OLED industries. NIL includes pressing a mold prototype having a pattern (generally referred to as mold, stamp, or template) on a photoresist material to mechanically deform the mold prototype so as to precisely transfer a fine pattern. Therefore, once the manufacture of the mold is complete, a fine structure such as a nano structure can be repeatedly molded in a simple manner, and manufacturing costs and the production of harmful waste in the manufacture can be effectively reduced. As a result, NIL has been expected to be applied in various areas in recent years.

However, after NIL transfers a pattern to a photoresist material, comprehensive exposure needs to be performed, and therefore the patterned photoresist layer to be formed and unnecessary residual photoresist material are both exposed to light. As a result, the residual photoresist layer cannot be removed by a developing solution in a simple manner. Therefore, unnecessary photoresist residue needs to be removed using inductively-coupled plasma (ICP) or reactive ion etching (RIE), such that the photoresist pattern to be formed is readily damaged and the process yield is poor. Moreover, if the thickness of unnecessary residual photoresist material is too great, then the residual photoresist material may not be completely removed using ICP or RIE.

SUMMARY OF THE INVENTION

The invention provides a manufacturing method of a circuit board in which photoresist residue or dielectric residue is removed using an adhesive layer.

The invention provides a stamp that can be used in the manufacturing method of a circuit board.

The manufacturing method of a circuit board of the invention includes the following steps. A dielectric substrate is provided. A circuit pattern and a dielectric layer covering the circuit pattern are formed on a dielectric substrate. A conductive via connected to the circuit pattern is formed in the dielectric layer. A photoresist material layer is formed on the dielectric layer. An imprinting process is performed on the photoresist material layer using a stamp to form a patterned photoresist layer, wherein the pressing side of the stamp facing the circuit pattern becomes sticky when subjected to pressure so as to catch photoresist residue from the photoresist material layer in the imprinting process. A patterned metal layer is formed on a region exposed by the patterned photoresist layer. The patterned photoresist layer is removed.

In an embodiment of the manufacturing method of a circuit board of the invention, the photoresist material layer is, for instance, a negative photoresist material layer, and the imprinting process includes the following steps: performing imprinting on the photoresist material layer via the stamp; allowing light to pass through the stamp to perform exposure on the photoresist material layer; removing the stamp.

In an embodiment of the manufacturing method of a circuit board of the invention, the photoresist material layer is, for instance, a positive photoresist material layer, and the imprinting process includes the following steps: performing imprinting on the photoresist material layer via the stamp; removing the stamp.

The manufacturing method of a circuit board of the invention includes the following steps. A dielectric substrate is provided. A circuit pattern is formed on the dielectric substrate. A dielectric layer is formed on the dielectric substrate, and the dielectric layer covers the circuit pattern. An imprinting process is performed on the dielectric layer via the stamp to form a patterned dielectric layer, wherein the pressing side of the stamp facing the circuit pattern becomes sticky when subjected to pressure, so as to catch dielectric residue from the dielectric layer in the imprinting process, and wherein the patterned dielectric layer has a hole exposing a portion of the circuit pattern and a trench not exposing the circuit pattern. An embedded circuit layer is formed in the trench and a conductive via electrically connected to the circuit pattern is formed in the hole.

In an embodiment of the manufacturing method of a circuit board of the invention, the dielectric layer is, for instance, a negative photosensitive dielectric layer, and the imprinting process includes the following steps: performing imprinting on the dielectric layer via the stamp; allowing light to pass through the stamp to perform exposure on the dielectric layer; removing the stamp.

In an embodiment of the manufacturing method of a circuit board of the invention, the dielectric layer is, for instance, a positive photosensitive dielectric layer, and the imprinting process includes the following steps: performing imprinting on the dielectric layer via the stamp; removing the stamp.

The stamp of the invention is used to perform imprinting on the photoresist material layer, wherein the stamp has a pressing side facing the photoresist material layer, and the pressing side becomes sticky when subjected to pressure so as to catch photoresist residue from the photoresist material layer in the imprinting process.

In an embodiment of the stamp of the invention, the pressing side is, for instance, a portion of the stamp, and the material of the pressing side is a pressure-sensitive adhesive material, and the pressure-sensitive adhesive material becomes sticky when subjected to pressure.

In an embodiment of the stamp of the invention, the pressing side includes a portion of the stamp and an adhesive layer attached to the portion, the material of the adhesive layer is a pressure-sensitive adhesive material, and the pressure-sensitive adhesive material becomes sticky when subjected to pressure.

Based on the above, in the invention, since the pressing side of the stamp becomes sticky when subjected to pressure in the imprinting process, in the forming process of the patterned photoresist layer or the patterned dielectric layer, photoresist residue or dielectric residue can be caught via a sticky pressing side. As a result, when the stamp is removed, photoresist residue or dielectric residue can be readily removed.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
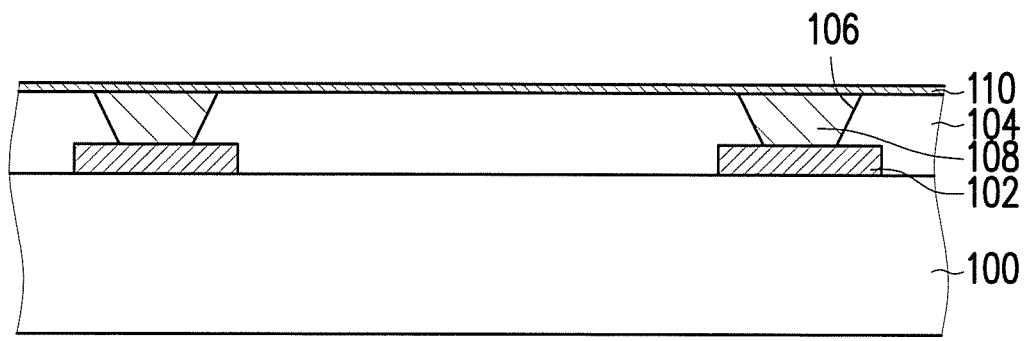
FIG. 1A to FIG. 1F are cross-sectional schematics of the manufacturing process of a circuit board shown according to the first embodiment of the invention.

In each of the following embodiments, in the forming process of a patterned photoresist layer or a patterned dielectric layer, photoresist residue or dielectric residue is caught via the pressing side of a stamp becoming sticky when subjected to pressure, and therefore photoresist residue or dielectric residue can be readily removed when the stamp is removed. As a result, an additional residue removal treatment does not need to be performed.

First Embodiment

FIG. 1A to FIG. 1F are cross-sectional schematics of the manufacturing process of a circuit board shown according to the first embodiment of the invention. First, referring to FIG. 1A, a circuit pattern 102 is formed on a dielectric substrate 100. The forming method of the circuit pattern 102 includes, for instance, forming a conductive layer on the dielectric substrate 100 via a lamination method on the conductive layer and performing a patterning process. The material of the dielectric substrate 100 is, for instance, epoxy resin, glass fiber cloth, or ceramic. The material of the conductive layer is, for instance, copper. Next, a dielectric layer 104 is formed on the dielectric substrate 100. The dielectric layer 104 covers the circuit pattern 102 on the dielectric substrate 100. The material of the dielectric layer 104 is, for instance, epoxy resin. The dielectric layer 104 is, for instance, formed on the dielectric substrate 100 via a lamination method. Next, a hole 106 exposing a portion of the circuit pattern 102 is formed in the dielectric layer 104. The forming method of the hole 106 includes, for instance, performing laser drilling or mechanical drilling. Then, a conductive layer 108 is formed in the hole 106. The material of the conductive layer 108 is, for instance, copper, and the forming method thereof includes, for instance, performing an electroplating process. Alternatively, the material of the conductive layer 108 is, for instance, conductive gel, and the forming method thereof includes, for instance, performing a stuffing process. The conductive layer 108 is used as a conductive via for connecting the circuit pattern 102. Then, a conductive seed layer 110 is formed on the dielectric layer 110 and the conductive layer 108. The material of the conductive seed layer 110 is, for instance, copper.

Figure 1B:
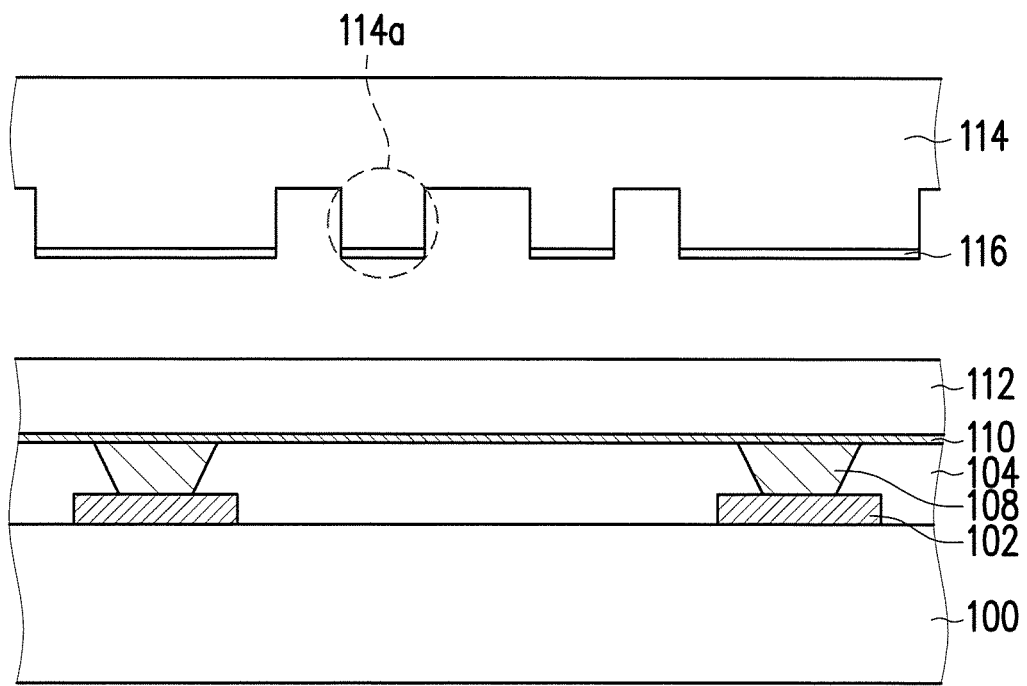

Then, referring to FIG. 1B, a photoresist material layer 112 is formed on the conductive seed layer 110. The forming method of the photoresist material layer 112 is, for instance, a spin coating method. In the present embodiment, the photoresist material layer 112 is, for instance, a negative photoresist material layer, and a portion thereof irradiated by UV light in a subsequent exposure process can be curied. Moreover, a stamp 114 is provided to perform an imprinting process on the photoresist material layer 112. The stamp 114 has a pattern corresponding to the circuit pattern to be formed in the dielectric layer 104. When the stamp 114 is pressed on the photoresist material layer 112, mechanical deformation can occur to the photoresist material layer 112, such that a pattern is precisely transferred to the photoresist material layer 112. Moreover, a pressing side 114a of the stamp 114 becomes sticky when subjected to pressure. In the present embodiment, the pressing side 114a includes a portion of the stamp 114 and an adhesive layer 116 attached to the portion. The material of the adhesive layer 116 can be a pressure-sensitive adhesive material becoming sticky when subjected to pressure that does not become sticky when not subjected to pressure. The pressure-sensitive adhesive material is, for instance, a phenolic resin pressure-sensitive adhesive material, a urea-formaldehyde pressure-sensitive adhesive material, a melamine resin pressure-sensitive adhesive material, a polyvinyl acetate resin pressure-sensitive adhesive material, polyethylene-vinyl acetate resin pressure-sensitive adhesive material, a polyacrylic resin pressure-sensitive adhesive material, polyurethane, epoxy resin, or neoprene.

Figure 1C:
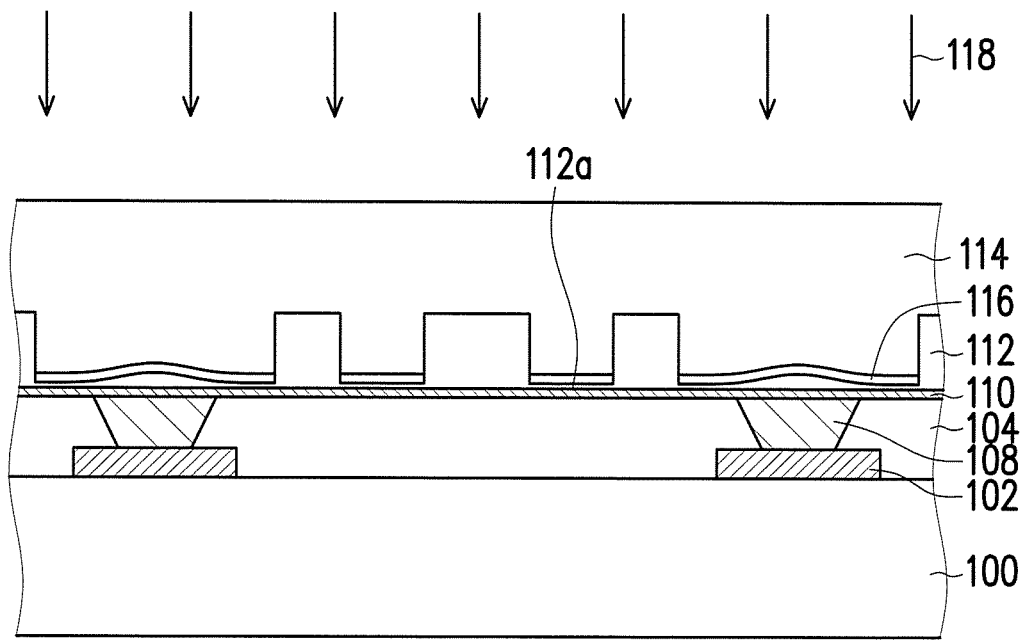

Next, referring to FIG. 1C, an imprinting process is performed on the photoresist material layer 112 using the stamp 114. Specifically, imprinting is performed on the photoresist material layer 112 via the stamp 114. When the stamp 114 is pressed on the photoresist material layer 112, the photoresist material layer 112 is deformed, such that the pattern of the stamp 114 can be precisely transferred to the photoresist material layer 112. When the imprinting is performed, a very thin and unavoidable photoresist residue 112a is generally formed between the stamp 114 and the conductive seed layer 110. In particular, for the large contact area between the stamp 114 and the conductive seed layer 110, the very thin and unavoidable photoresist residue 112a is largely concentrated in the center of the contact region, and the thickness distribution thereof shows a roughly Gaussian distribution from the periphery to the center. Since the stamp 114 is generally faulted by a polymer material, as shown in FIG. 1C, the region of the stamp 114 in contact with the photoresist residue 112a is slightly deformed with the photoresist residue 112a. Next, an exposure process is performed on the imprinted photoresist material layer 112 to cure the photoresist material layer 112. In the present embodiment, comprehensive irradiation is performed on the imprinted photoresist material layer 112 using a UV light 118. When the UV light 118 passes through the stamp 114 and is irradiated on the photoresist material layer 112, a cross-linking reaction can occur to the photoresist material layer 112 such that the photoresist material layer 112 is curied.

Figure 1D:
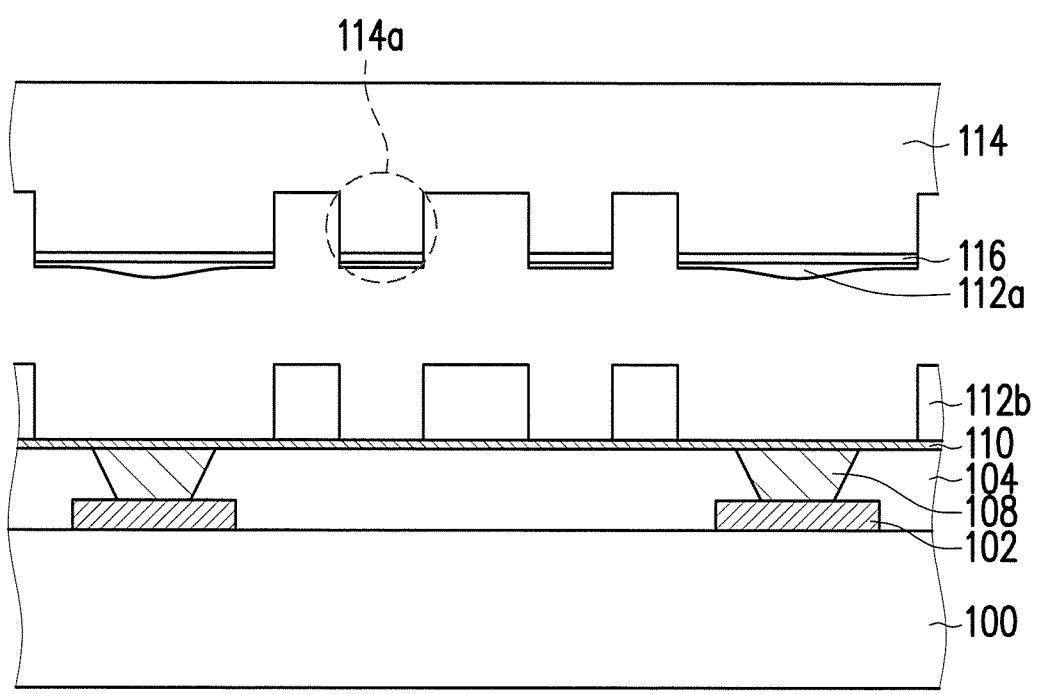

Next, referring to FIG. 1D, the stamp 114 is removed. Since the pressing side 114a of the stamp 114 becomes sticky when subjected to pressure in the imprinting process, the pressing side 114a can catch the photoresist residue 112a (in the present embodiment, the photoresist residue 112a is attached via the adhesive layer 116). As a result, when the stamp 114 is removed, the photoresist residue 112a can be removed with the adhesive layer 116 and does not remain on the conductive seed layer 110. After the stamp 114 is removed, a patterned photoresist layer 112b is formed on the conductive seed layer 110. The region exposed by the patterned photoresist layer 112b is the region in which a circuit pattern is to be subsequently formed.

It should be mentioned that, for the average photoresist material, the adhesion thereof to a conductive seed layer is less than 3 kg/in., and therefore the selection of the material of the adhesive layer 116 only needs to satisfy an adhesion greater than or equal to 3 kg/in. (preferably greater than 3.75 kg/in.) to the photoresist residue 112a after the material becomes sticky when subjected to pressure. As a result, the photoresist residue 112a can be effectively removed when the stamp 114 is removed. In the present embodiment, commercial pressure-sensitive gel can be used as the adhesive layer 116, and examples include, for instance, VHB-4913, VHB-4914, and VHB-4920 made by 3M.

Figure 1E:
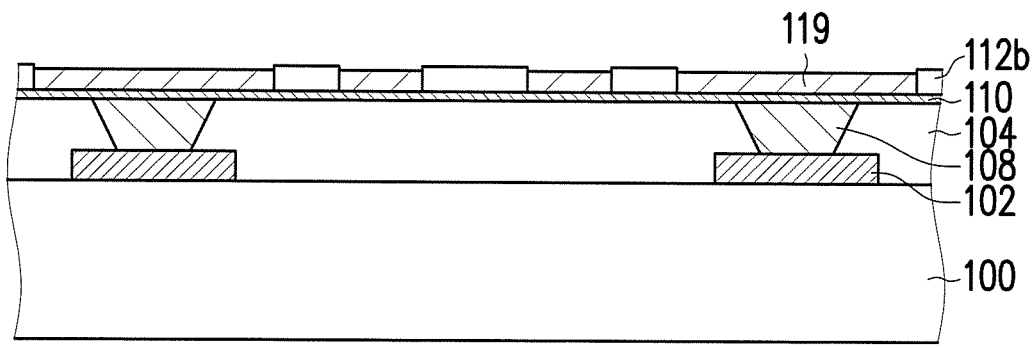

Then, referring to FIG. 1E, a patterned metal layer 119 is formed on the region exposed by the patterned photoresist layer 112b. The material of the patterned metal layer 119 is, for instance, copper. The forming method of the patterned metal layer 119 includes, for instance, performing an electroplating process using the conductive seed layer 110.

Figure 1F:
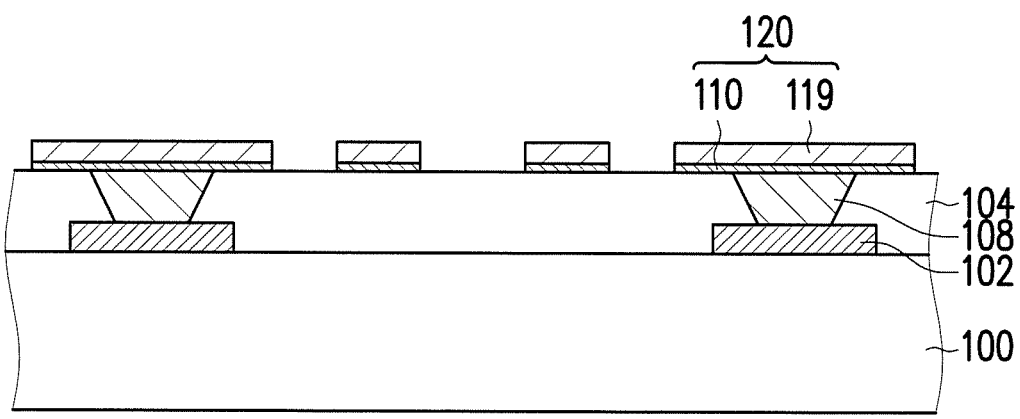

Next, referring to FIG. 1F, the patterned photoresist layer 102b is removed. The method of removing the patterned photoresist layer 112b includes, for instance, performing a wet stripping process. Next, the conductive seed layer 110 below the patterned photoresist layer 112b is removed. The method of removing the conductive seed layer 110 includes, for instance, performing a flash etch process. In this way, the manufacture of a circuit board 10 of the present embodiment is complete. In the circuit board 10, the patterned metal layer 119 on the dielectric layer 104 and the conductive seed layer 110 below the patterned metal layer 119 form a circuit pattern 120, and the circuit pattern 120 is connected to the circuit pattern 102 via the conductive via 108.

In the present embodiment, when the stamp 114 is removed, the photoresist residue 112a can be removed with the adhesive layer 116, and therefore the photoresist residue 112a does not remain on the conductive seed layer 110. Accordingly, after the stamp 114 is removed, an additional photoresist residue removal process does not need to be performed, and therefore damage to the resulting patterned photoresist layer 112b can be prevented.

It should be mentioned that, in the present embodiment, the photoresist material layer 112 is a negative photoresist material layer, but the invention is not limited thereto. In another embodiment, the photoresist material layer 112 can also be a positive photoresist material layer. When the photoresist material layer 112 is a positive photoresist material layer, in the step of FIG. 1C, after imprinting is performed on the photoresist material layer 112 via the stamp 114, an exposure process does not need to be performed, and the stamp 114 can be directly removed (as shown in FIG. 1D).

Moreover, in the present embodiment, the pressing side 114a becoming sticky in the imprinting process includes a portion of the stamp 114 and the adhesive layer 116 attached to the portion, but the invention is not limited thereto. In another embodiment, the entire pressing side 114a becoming sticky in the imprinting process can be a portion of the stamp 114, i.e., the stamp 114 itself is formed by a pressure-sensitive adhesive material. As a result, the additional adhesive layer 116 is not needed. The pressure-sensitive adhesive material is as described above and is not repeated herein.

Second Embodiment

FIG. 2A to FIG. 2D are cross-sectional schematics of the manufacturing process of a circuit board shown according to the second embodiment of the invention. First, referring to FIG. 2A, a circuit pattern 202a is formed on a first surface 200a of a dielectric substrate 200, and a circuit pattern 202b is formed on a second surface 200b of the dielectric substrate 200. The forming method of the circuit patterns 202a and 202b includes, for instance, forming a conductive layer respectively on the first surface 200a and the second surface 200b via a lamination method and performing a patterning process on the conductive layer. The material of the dielectric substrate 200 is, for instance, epoxy resin, glass fiber cloth, or ceramic. The material of the conductive layer is, for instance, copper. Then, a dielectric layer 204a is formed on the first surface 200a and a dielectric layer 204b is formed on the second surface 200b. The dielectric layer 204a covers the circuit pattern 202a on the first surface 200a and the dielectric layer 204b covers the circuit pattern 202b on the second surface 200b. In the present embodiment, the dielectric layers 204a and 204b are, for instance, negative photosensitive dielectric layers, and a portion thereof irradiated by UV light in a subsequent exposure process can be curied. The dielectric layers 204a and 204b are, for instance, respectively formed on the first surface 200a and the second surface 200b via a lamination method.

Figure 2A:
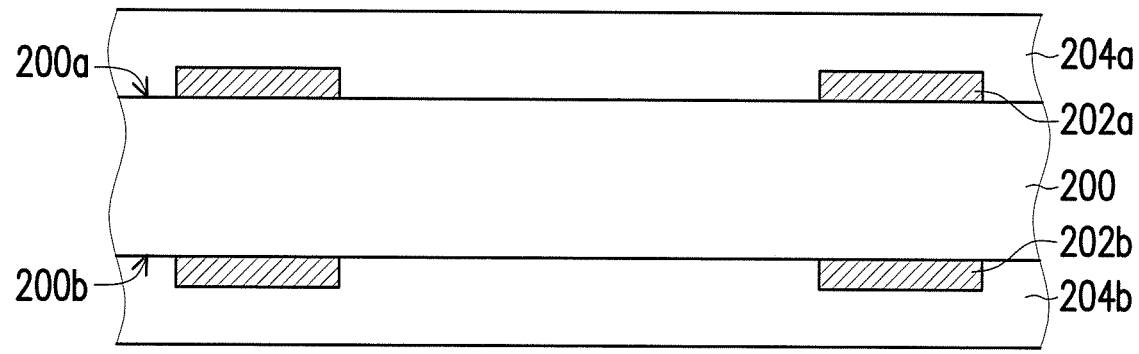
FIG. 2A to FIG. 2D are cross-sectional schematics of the manufacturing process of a circuit board shown according to the second embodiment of the invention.
Figure 2B:
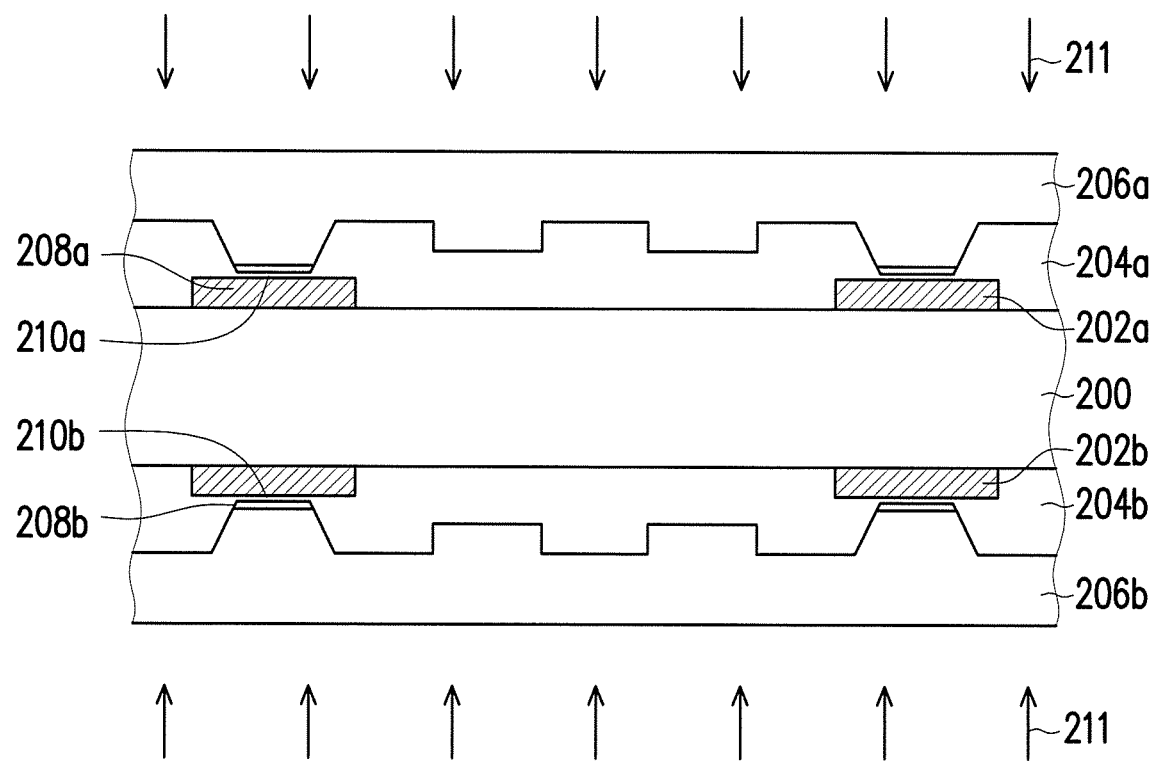

Next, referring to FIG. 2B, an imprinting process is performed on the dielectric layer 204a via a stamp 206a and an imprinting process is performed on the dielectric layer 204b via a stamp 206b. The stamps 206a and 206b respectively have patterns of the conductive via corresponding to the circuit patterns to be formed in the dielectric layers 204a and 204b. When the stamp 206a is pressed on the dielectric layer 204a and the stamp 206b is pressed on the dielectric layer 204b, the dielectric layers 204a and 204b are mechanically deformed, and therefore patterns are precisely transferred to the dielectric layers 204a and 204b. Moreover, similar to the stamp 114 in the first embodiment, the pressing sides of the stamps 206a and 206b become sticky when subjected to pressure. In the present embodiment, the pressing side of the stamp 206a includes a portion of the stamp 206a and an adhesive layer 208a attached to the portion, and the pressing side of the stamp 206b includes a portion of the stamp 206b and an adhesive layer 208b attached to the portion. The material of the adhesive layers 208a and 208b can be a pressure-sensitive adhesive material becoming sticky when subjected to pressure that does not become sticky when not subjected to pressure. The pressure-sensitive adhesive material is as described above and is not repeated herein.

Specifically, imprinting is performed on the dielectric layer 204a via the stamp 206a and imprinting is performed on the dielectric layer 204b via the stamp 206b. When the stamp 206a is pressed on the dielectric layer 204a, the dielectric layer 204a is deformed, such that the pattern of the stamp 206a can be precisely transferred to the dielectric layer 204a. Moreover, when the stamp 206b is pressed on the dielectric layer 204b, the dielectric layer 204b is deformed, such that the pattern of the stamp 206b can be precisely transferred to the dielectric layer 204b. When the imprinting is performed, a very thin and unavoidable dielectric residue 210a is generally formed between the stamp 206a and the circuit pattern 202a, and a very thin and unavoidable dielectric residue 210b is generally formed between the stamp 206b and the circuit pattern 202b. Next, an exposure process is performed on the imprinted dielectric layers 204a and 204b to cure the dielectric layers 204a and 204b. In the present embodiment, comprehensive irradiation is performed on the imprinted dielectric layers 204a and 204b using a UV light 211. When the UV light 211 passes through the stamps 206a and 206b and is irradiated on the dielectric layers 204a and 204b, a cross-linking reaction can occur to the dielectric layers 204a and 204b such that the dielectric layers 204a and 204b are curied.

Figure 2C:
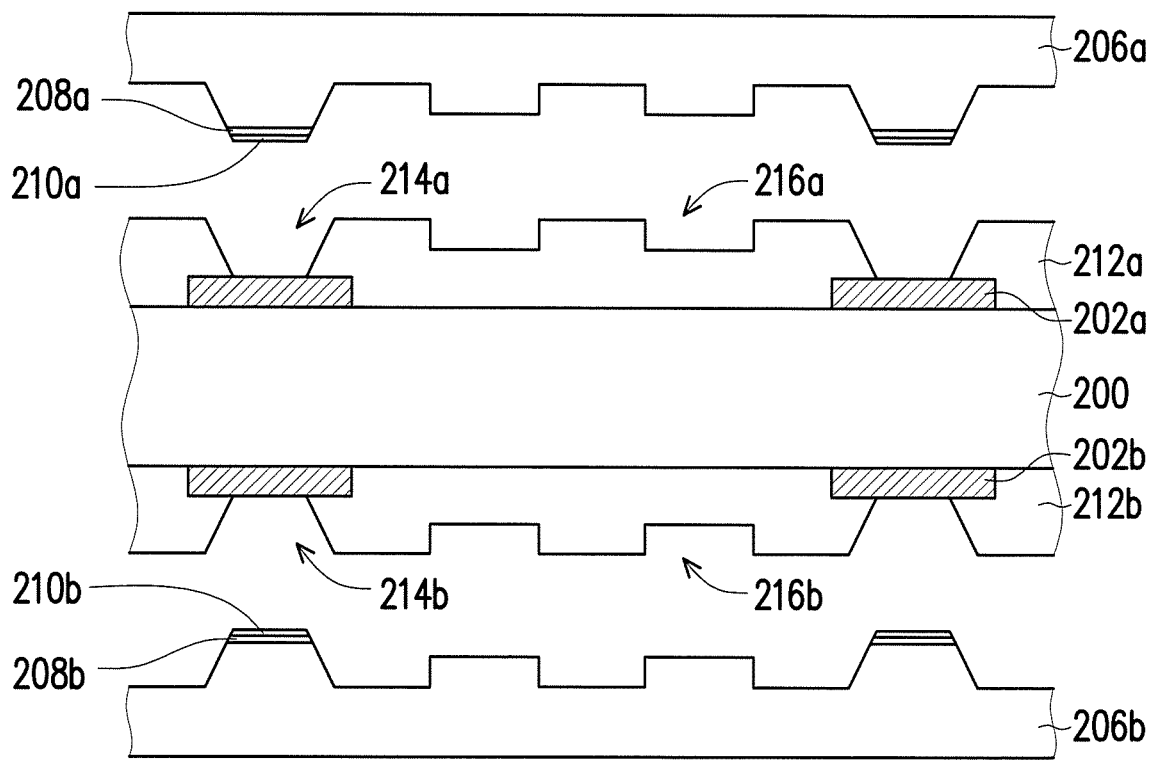

Next, referring to FIG. 2C, the stamps 206a and 206b are removed. Since the pressing sides of the stamps 206a and 206b become sticky when subjected to pressure in the imprinting process, the pressing sides can catch the dielectric residues 210a and 210b (in the present embodiment, the dielectric residue 210a is caught by the adhesive layer 208a and the dielectric residue 210b is caught by the adhesive layer 208b). As a result, when the stamps 206a and 206b are removed, the dielectric residue 210a can be removed with the adhesive layer 208a, and the dielectric residue 210b can be removed with the adhesive layer 208b without remaining on the circuit patterns 202a and 202b. After the stamps 206a and 206b are removed, patterned dielectric layers 212a and 212b are formed. The patterned dielectric layer 212a has a hole 214a exposing a portion of the circuit pattern 202a and a trench 216a not exposing the circuit pattern 202a, and the patterned dielectric layer 212b has a hole 214b exposing a portion of the circuit pattern 202b and a trench 216b not exposing the circuit pattern 202b.

Figure 2D:
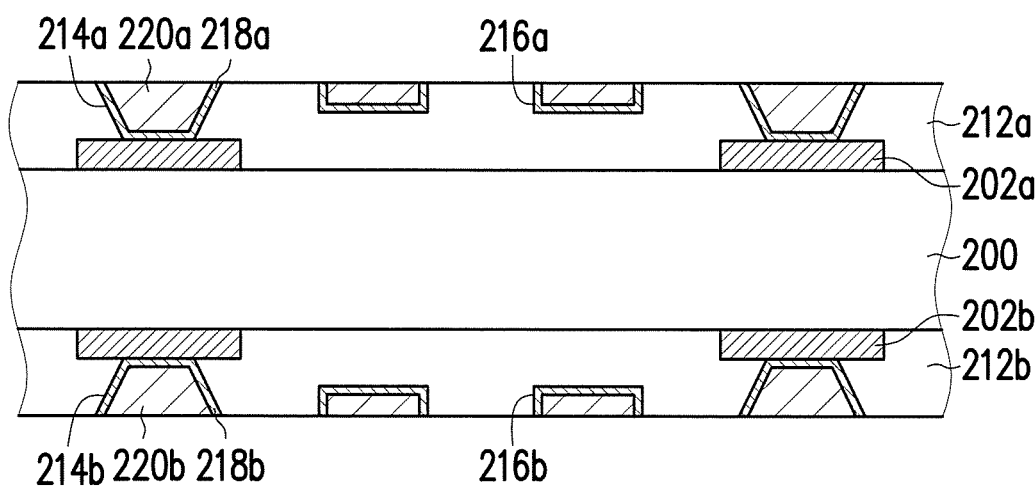

Next, referring to FIG. 2D, a conductive seed layer 218a and a patterned metal layer 220a are formed in both the hole 214a and the trench 216a, and a conductive seed layer 218b and a patterned metal layer 220b are formed in both the hole 214b and the trench 216b. Specifically, the conductive seed layer 218a is conformally formed on the patterned dielectric layer 212a and the conductive seed layer 218b is conformally formed on the patterned dielectric layer 212b. Next, an electroplating process is performed using the conductive seed layers 218a and 218b to form a metal layer on the conductive seed layer 218a and to form a metal layer on the conductive seed layer 218b. Next, a planarization process (such as a chemical-mechanical polishing process) is performed to remove the conductive seed layer 218a and the metal layer outside the hole 214a and the trench 216a and to remove the conductive seed layer 218b and the metal layer outside the hole 214b and the trench 216b. In this way, the manufacture of a circuit board 20 of the present embodiment is complete. In the circuit board 20, the conductive seed layer 218a and the patterned metal layer 220a in the hole 214a form a conductive via connected to the circuit pattern 202a, and the conductive seed layer 218b and the patterned metal layer 220b in the hole 214b form a conductive via connected to the circuit pattern 202b. Moreover, the conductive seed layer 218a and the patterned metal layer 220a in the trench 216a and the conductive seed layer 218b and the patterned metal layer 220b in the trench 216b are used as embedded circuit layers in the circuit board 20.

It should be mentioned that, in the present embodiment, the dielectric layers 204a and 204b are negative photosensitive dielectric layers, but the invention is not limited thereto. In another embodiment, the dielectric layers 204a and 204b can also be positive photosensitive dielectric layers. When the dielectric layers 204a and 204b are positive photosensitive dielectric layers, in the step of FIG. 2B, an exposure process does not need to be performed after imprinting is performed on the dielectric layer 204a via the stamp 206a and imprinting is performed on the dielectric layer 204b via the stamp 206b, and the stamps 206a and 206b can be directly removed (as shown in FIG. 2C).

Moreover, in the present embodiment, the pressing side becoming sticky in the imprinting process includes a portion of the stamp itself and the adhesive layer attached to the portion, but the invention is not limited thereto. In another embodiment, the entire pressing side becoming sticky in the imprinting process can be a portion of the stamp itself, i.e., the stamps 206a and 206b themselves are formed by a pressure-sensitive adhesive material. As a result, an additional adhesive layer is not needed. The pressure-sensitive adhesive material is as described above and is not repeated herein.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a circuit board, comprising:
   providing a dielectric substrate, wherein a circuit pattern, a dielectric layer covering the circuit pattern, and a conductive via located in the dielectric layer and connected to the circuit pattern are disposed on the dielectric substrate;
   forming a photoresist material layer on the dielectric layer;
   performing an imprinting process on the photoresist material layer via a stamp to form a patterned photoresist layer, wherein a pressing side of the stamp facing the circuit pattern becomes sticky when subjected to a pressure so as to completely catch and remove a photoresist residue from the photoresist material layer in the imprinting process, wherein a material of the pressing side is a pressure-sensitive adhesive material, and the pressure-sensitive adhesive material becomes sticky when subjected to the pressure;
   forming a patterned metal layer on a region exposed by the patterned photoresist layer; and
   removing the patterned photoresist layer.

2. The manufacturing method of the circuit board of claim 1, wherein the photoresist material layer is a negative photoresist material layer, and the imprinting process comprises:
   performing imprinting on the photoresist material layer via the stamp;
   allowing light to pass through the stamp to perform exposure on the photoresist material layer; and
   removing the stamp.

3. The manufacturing method of the circuit board of claim 1, wherein the photoresist material layer is a positive photoresist material layer, and the imprinting process comprises:
   performing imprinting on the photoresist material layer via the stamp; and
   removing the stamp.

4. A manufacturing method of a circuit board, comprising:
   providing a dielectric substrate, wherein a circuit pattern and a dielectric layer covering the circuit pattern are disposed on the dielectric substrate;
   performing an imprinting process on the dielectric layer via the stamp to form a patterned dielectric layer, wherein a pressing side of the stamp facing the circuit pattern becomes sticky when subjected to a pressure, so as to completely catch and remove a dielectric residue from the dielectric layer in the imprinting process, wherein a material of the pressing side is a pressure-sensitive adhesive material, and the pressure-sensitive adhesive material becomes sticky when subjected to the pressure, and wherein the patterned dielectric layer has a hole exposing a portion of the circuit pattern and a trench not exposing the circuit pattern; and forming an embedded circuit layer in the trench and forming a conductive via electrically connected to the circuit pattern in the hole.

5. The manufacturing method of the circuit board of claim 4, wherein the dielectric layer is a negative photosensitive dielectric layer, and the imprinting process comprises:

performing imprinting on the dielectric layer via the stamp;

allowing light to pass through the stamp to perform exposure on the dielectric layer; and removing the stamp.

6. The manufacturing method of the circuit board of claim 4, wherein the dielectric layer is a positive photosensitive dielectric layer, and the imprinting process comprises:

performing imprinting on the dielectric layer via the stamp; and removing the stamp.

\* \* \* \* \*